(12) United States Patent
Hussell

(10) Patent No.: US 11,101,408 B2
(45) Date of Patent: Aug. 24, 2021

(54) COMPONENTS AND METHODS FOR LIGHT EMITTING DIODE (LED) LIGHTING

(75) Inventor: Christopher P. Hussell, Cary, NC (US)

(73) Assignee: CreeLED, Inc., Newark, CA (US)

( * ) Notice: Subject to any disclaimer, the term of this patent is extended or adjusted under 35 U.S.C. 154(b) by 585 days.

(21) Appl. No.: 13/367,929

(22) Filed: Feb. 7, 2012

(65) Prior Publication Data

US 2013/0003375 A1  Jan. 3, 2013

Related U.S. Application Data

(60) Provisional application No. 61/440,204, filed on Feb. 7, 2011.

(51) Int. Cl.
*H01L 33/00* (2010.01)
*H01L 33/48* (2010.01)
*H01L 33/60* (2010.01)

(52) U.S. Cl.
CPC ............ *H01L 33/486* (2013.01); *H01L 33/60* (2013.01); *H01L 2224/73265* (2013.01)

(58) Field of Classification Search
None
See application file for complete search history.

(56) References Cited

U.S. PATENT DOCUMENTS

| | | |
|---|---|---|
| 4,679,118 A | 7/1987 | Johnson et al. |
| 4,946,547 A | 8/1990 | Palmour |
| 5,200,022 A | 4/1993 | Kong |
| 5,210,051 A | 5/1993 | Carter, Jr. |
| RE34,861 E | 2/1995 | Davis et al. |
| 5,393,993 A | 2/1995 | Edmond |
| 5,493,393 A | 2/1996 | Beranek et al. |
| 5,506,446 A | 4/1996 | Hoffman et al. |
| 5,523,589 A | 6/1996 | Edmond |
| 6,020,632 A | 2/2000 | Barone et al. |
| 6,274,924 B1 | 8/2001 | Carey et al. |
| 6,335,548 B1 | 1/2002 | Roberts et al. |
| 6,498,355 B1 | 12/2002 | Harrah |

(Continued)

FOREIGN PATENT DOCUMENTS

| | | |
|---|---|---|
| CN | 1194461 | 9/1998 |
| CN | 1720608 A | 1/2006 |

(Continued)

OTHER PUBLICATIONS

Communication under Article 94(3) EPC for Application No. 10 783 782.5 dated Mar. 9, 2016.

(Continued)

*Primary Examiner* — Ali Naraghi
(74) *Attorney, Agent, or Firm* — Jenkins, Wilson, Taylor & Hunt, P.A.

(57) ABSTRACT

Components and methods containing one or more light emitter devices, such as light emitting diodes (LEDs) or LED chips, are disclosed. In one aspect, a light emitter device component can include inner walls forming a recess defining an opening such that surface area outside of the opening of the recess is less than or equal to a threshold ratio of overall surface area. In one aspect, the light emitter device component can include a ceramic body mounted directly or indirectly on the ceramic body. Components disclosed herein can result in improved light extraction and thermal management.

35 Claims, 6 Drawing Sheets

(56) References Cited

U.S. PATENT DOCUMENTS

| | | |
|---|---|---|
| 6,610,563 B1 | 8/2003 | Waitl |
| 6,674,159 B1 * | 1/2004 | Peterson .............. B81B 7/0067 |
| | | 257/431 |
| 6,806,583 B2 | 10/2004 | Koay et al. |
| 6,828,170 B2 | 12/2004 | Roberts et al. |
| 6,874,910 B2 | 4/2005 | Sugimoto et al. |
| 6,921,927 B2 | 7/2005 | Ng et al. |
| 6,936,855 B1 | 8/2005 | Harrah |
| 6,943,433 B2 | 9/2005 | Kamada |
| 6,949,771 B2 | 9/2005 | Yoganander et al. |
| D514,073 S | 1/2006 | Suenaga |
| 7,081,661 B2 | 7/2006 | Takehara et al. |
| 7,098,483 B2 | 8/2006 | Mazzochette et al. |
| 7,224,047 B2 | 5/2007 | Carberry et al. |
| 7,244,965 B2 | 7/2007 | Andrews et al. |
| 7,249,790 B2 | 7/2007 | Condie et al. |
| 7,253,448 B2 | 8/2007 | Roberts et al. |
| 7,329,942 B2 | 2/2008 | Tsou et al. |
| D566,055 S | 4/2008 | Kim |
| 7,361,940 B2 | 4/2008 | Kim et al. |
| 7,391,046 B2 | 6/2008 | Tsutsumi et al. |
| D573,113 S | 7/2008 | Bando |
| D573,114 S | 7/2008 | Min et al. |
| 7,400,049 B2 | 7/2008 | Shim |
| 7,432,589 B2 | 10/2008 | Yamamoto et al. |
| D580,375 S | 11/2008 | Yen |
| D580,381 S | 11/2008 | Bando |
| D580,891 S | 11/2008 | Sung et al. |
| 7,456,499 B2 | 11/2008 | Loh |
| 7,462,870 B2 | 12/2008 | Nakashima |
| D584,699 S | 1/2009 | Bando |
| D594,827 S | 6/2009 | Loh et al. |
| 7,564,180 B2 | 6/2009 | Brandes |
| D595,675 S | 7/2009 | Wang et al. |
| 7,566,159 B2 | 7/2009 | Oon et al. |
| D597,968 S | 8/2009 | Kobayakawa et al. |
| D597,971 S | 8/2009 | Kobayakawa et al. |
| D598,400 S | 8/2009 | Bando |
| 7,592,638 B2 * | 9/2009 | Kim .................. H01L 33/60 |
| | | 257/100 |
| 7,659,551 B2 | 2/2010 | Loh |
| D614,592 S | 4/2010 | Hussell et al. |
| 7,692,206 B2 | 4/2010 | Loh |
| D615,504 S | 5/2010 | Keller et al. |
| 7,714,334 B2 | 5/2010 | Lin |
| 7,719,024 B2 | 5/2010 | Bando |
| D621,798 S | 8/2010 | Lu et al. |
| D621,799 S | 8/2010 | Hussell et al. |
| D622,680 S | 8/2010 | Lin et al. |
| 7,791,061 B2 | 9/2010 | Edmond et al. |
| D626,095 S | 10/2010 | Hseih |
| D627,310 S | 11/2010 | Lin et al. |
| 7,825,422 B2 | 11/2010 | Maeda et al. |
| D628,541 S | 12/2010 | Lin |
| 7,852,015 B1 | 12/2010 | Yen et al. |
| 7,858,993 B2 | 12/2010 | Kong et al. |
| D632,267 S | 2/2011 | Chen et al. |
| D632,659 S | 2/2011 | Hseih |
| D634,284 S | 3/2011 | Ko et al. |
| D634,285 S | 3/2011 | Ko et al. |
| D634,286 S | 3/2011 | Ko et al. |
| D634,716 S | 3/2011 | Suzuki |
| D635,527 S | 4/2011 | Hussell et al. |
| 7,923,739 B2 * | 4/2011 | Hussell ............ H01L 25/0753 |
| | | 257/88 |
| 7,927,901 B2 | 4/2011 | Fang et al. |
| 7,960,819 B2 | 6/2011 | Loh et al. |
| D641,719 S | 7/2011 | Hussell et al. |
| D643,819 S | 8/2011 | Joo |
| 7,989,840 B2 | 8/2011 | Sanpei et al. |
| 8,018,135 B2 | 9/2011 | Van de Ven et al. |
| D648,686 S | 11/2011 | Hussell et al. |
| D648,687 S | 11/2011 | Joo et al. |
| 8,058,088 B2 | 11/2011 | Cannon |
| 8,115,369 B2 | 2/2012 | Kang et al. |
| D658,599 S | 5/2012 | Takahashi et al. |
| D659,657 S | 5/2012 | Hussell et al. |
| 8,188,687 B2 | 5/2012 | Lee et al. |
| D661,264 S | 6/2012 | Joo et al. |
| D667,801 S | 9/2012 | Joo et al. |
| 8,269,244 B2 | 9/2012 | Hussell |
| 8,278,680 B2 | 10/2012 | Lan et al. |
| 8,304,660 B2 | 11/2012 | Tuan et al. |
| 8,337,029 B2 | 12/2012 | Li |
| 8,354,992 B2 | 1/2013 | Rumreich et al. |
| D679,842 S | 4/2013 | Joo et al. |
| 8,408,748 B2 | 4/2013 | Janik et al. |
| 8,497,522 B2 | 7/2013 | Hussell |
| 8,508,140 B2 | 8/2013 | Leung et al. |
| 8,598,602 B2 | 12/2013 | Hussell |
| 8,610,140 B2 | 12/2013 | Joo |
| 8,643,271 B2 | 2/2014 | Shimonishi et al. |
| 8,648,359 B2 | 2/2014 | Hussell |
| 8,686,445 B1 | 4/2014 | Hussell et al. |
| D704,358 S | 5/2014 | Joo et al. |
| 8,735,931 B2 | 5/2014 | Han et al. |
| D708,156 S | 7/2014 | Joo et al. |
| 8,766,313 B2 | 7/2014 | Kashitani et al. |
| 8,860,043 B2 | 10/2014 | Emerson et al. |
| 8,866,166 B2 | 10/2014 | Hussell |
| 8,878,217 B2 | 11/2014 | Hussell |
| 8,895,998 B2 | 11/2014 | Hussell et al. |
| 9,024,349 B2 | 5/2015 | Chitnis et al. |
| 9,111,778 B2 | 8/2015 | Emerson et al. |
| 9,123,874 B2 | 9/2015 | Hussell et al. |
| 9,159,888 B2 | 10/2015 | Chitnis et al. |
| 9,786,825 B2 | 10/2017 | Hussell |
| 9,859,471 B2 | 1/2018 | Hussell et al. |
| 2001/0045640 A1 | 11/2001 | Oida et al. |
| 2002/0047189 A1 | 4/2002 | Yoshinori et al. |
| 2003/0168720 A1 | 9/2003 | Kamada |
| 2003/0189830 A1 | 10/2003 | Sugimoto et al. |
| 2004/0075100 A1 | 4/2004 | Bogner et al. |
| 2004/0079957 A1 | 4/2004 | Andrews et al. |
| 2004/0087057 A1 | 5/2004 | Wang et al. |
| 2004/0126913 A1 | 7/2004 | Loh |
| 2004/0222433 A1 | 11/2004 | Mazzochette et al. |
| 2005/0002818 A1 * | 1/2005 | Ichikawa ................ B22F 7/02 |
| | | 419/6 |
| 2005/0224830 A1 | 10/2005 | Blonder et al. |
| 2005/0269587 A1 | 12/2005 | Loh et al. |
| 2006/0006405 A1 | 1/2006 | Mazzochette |
| 2006/0043401 A1 | 3/2006 | Lee et al. |
| 2006/0118808 A1 | 6/2006 | Sadamu et al. |
| 2006/0147746 A1 | 7/2006 | Wakako et al. |
| 2006/0157726 A1 | 7/2006 | Loh et al. |
| 2006/0186418 A1 | 8/2006 | Edmond et al. |
| 2006/0220050 A1 | 10/2006 | Higaki et al. |
| 2006/0261357 A1 | 11/2006 | Tsou et al. |
| 2007/0029664 A1 | 2/2007 | Mohammed et al. |
| 2007/0052074 A1 | 3/2007 | Hasegawa |
| 2007/0057364 A1 | 3/2007 | Wang et al. |
| 2007/0075325 A1 | 4/2007 | Baek et al. |
| 2007/0114514 A1 * | 5/2007 | Ito ....................... H01L 33/60 |
| | | 257/13 |
| 2007/0120234 A1 | 5/2007 | Kim et al. |
| 2007/0138497 A1 | 6/2007 | Loh |
| 2007/0158668 A1 | 7/2007 | Tarsa |
| 2007/0241362 A1 * | 10/2007 | Han .................... H01L 33/62 |
| | | 257/100 |
| 2007/0252523 A1 | 11/2007 | Maeda et al. |
| 2007/0262328 A1 | 11/2007 | Bando |
| 2008/0006837 A1 | 1/2008 | Park et al. |
| 2008/0019133 A1 | 1/2008 | Kim et al. |
| 2008/0023722 A1 | 1/2008 | Lee et al. |
| 2008/0048201 A1 | 2/2008 | Kim et al. |
| 2008/0173884 A1 | 7/2008 | Chitnis |
| 2008/0179611 A1 | 7/2008 | Chitnis |
| 2008/0185605 A1 | 8/2008 | Wada et al. |
| 2008/0217633 A1 * | 9/2008 | Chang ................. H01L 33/507 |
| | | 257/98 |
| 2008/0258130 A1 | 10/2008 | Bergmann |
| 2008/0258162 A1 * | 10/2008 | Koung ................... H01L 24/97 |
| | | 257/98 |

(56) References Cited

U.S. PATENT DOCUMENTS

| | | |
|---|---|---|
| 2008/0261339 A1 | 10/2008 | Koung et al. |
| 2008/0278941 A1 | 11/2008 | Logan et al. |
| 2008/0283849 A1 | 11/2008 | Imai |
| 2008/0290353 A1 | 11/2008 | Medendorp et al. |
| 2009/0008662 A1 | 1/2009 | Ashdown et al. |
| 2009/0086487 A1 | 4/2009 | Ruud |
| 2009/0101921 A1 | 4/2009 | Lai |
| 2009/0121249 A1 | 5/2009 | Tseng et al. |
| 2009/0122533 A1 | 5/2009 | Brukilacchio |
| 2009/0140271 A1 | 6/2009 | Sah |
| 2009/0159905 A1 | 6/2009 | Chen |
| 2009/0189178 A1 | 7/2009 | Kim et al. |
| 2009/0262516 A1* | 10/2009 | Li ................. H01L 33/56 362/84 |
| 2009/0267085 A1 | 10/2009 | Lee et al. |
| 2009/0321779 A1 | 12/2009 | Chang et al. |
| 2010/0059783 A1 | 3/2010 | Chandra |
| 2010/0090239 A1* | 4/2010 | Lin ................. H01L 33/486 257/98 |
| 2010/0102345 A1* | 4/2010 | Kong ................. H01L 33/486 257/98 |
| 2010/0133554 A1* | 6/2010 | Hussell ............. H01L 25/0753 257/88 |
| 2010/0133578 A1 | 6/2010 | Pickard et al. |
| 2010/0155748 A1* | 6/2010 | Chan ................. H01L 33/62 257/89 |
| 2010/0155763 A1 | 6/2010 | Donofrio |
| 2010/0155766 A1* | 6/2010 | Ku ................. H01L 25/167 257/99 |
| 2010/0163887 A1 | 7/2010 | Kim et al. |
| 2010/0181582 A1 | 7/2010 | Li et al. |
| 2010/0193822 A1 | 8/2010 | Inobe et al. |
| 2010/0210048 A1 | 8/2010 | Urano |
| 2010/0212942 A1 | 8/2010 | Tuan et al. |
| 2010/0237360 A1 | 9/2010 | Kao et al. |
| 2010/0270577 A1 | 10/2010 | Rulkens et al. |
| 2011/0001162 A1* | 1/2011 | Nakayama ........ H01L 23/3677 257/99 |
| 2011/0006658 A1 | 1/2011 | Chan |
| 2011/0024888 A1* | 2/2011 | Pagaila ............. H01L 23/13 257/686 |
| 2011/0031865 A1 | 2/2011 | Hussell et al. |
| 2011/0089465 A1* | 4/2011 | Lin ................. H01L 21/486 257/99 |
| 2011/0090711 A1 | 4/2011 | Kim |
| 2011/0163683 A1 | 7/2011 | Steele et al. |
| 2011/0180827 A1 | 7/2011 | Hussell |
| 2011/0186873 A1 | 8/2011 | Emerson |
| 2011/0242450 A1 | 10/2011 | Kashimura et al. |
| 2011/0260200 A1 | 10/2011 | Chen |
| 2011/0316022 A1 | 12/2011 | Hussell |
| 2012/0069560 A1 | 3/2012 | Miskin et al. |
| 2012/0127720 A1 | 5/2012 | Hussell et al. |
| 2012/0153317 A1 | 6/2012 | Emerson et al. |
| 2012/0299022 A1 | 11/2012 | Hussell |
| 2012/0307481 A1 | 12/2012 | Joo et al. |
| 2012/0313135 A1 | 12/2012 | Kashitani et al. |
| 2013/0003375 A1 | 1/2013 | Hussell |
| 2013/0011946 A1 | 1/2013 | Hussell |
| 2013/0200406 A1 | 8/2013 | Hussell |
| 2013/0200420 A1 | 8/2013 | Hussell |
| 2014/0027801 A1 | 1/2014 | Hussell |
| 2014/0159088 A1 | 6/2014 | Hussell et al. |
| 2014/0217434 A1 | 8/2014 | Hussell et al. |
| 2014/0232288 A1 | 8/2014 | Brandes et al. |

FOREIGN PATENT DOCUMENTS

| | | |
|---|---|---|
| CN | 1925182 | 3/2007 |
| CN | 101060157 | 10/2007 |
| CN | 101060157 A | 10/2007 |
| CN | 101142692 A | 3/2008 |
| CN | 101142692 A | 3/2008 |
| CN | 201054361 | 4/2008 |
| CN | 101432896 | 5/2009 |
| CN | 101639181 | 2/2010 |
| CN | 101765627 A | 6/2010 |
| CN | 101794855 | 8/2010 |
| CN | 200930286397.5 | 10/2010 |
| CN | ZL 2011-30010728 | 1/2012 |
| CN | ZL201130171313.0 | 4/2012 |
| CN | 102460751 B | 7/2015 |
| CN | 103080646 B | 12/2016 |
| CN | 103534821 B | 3/2017 |
| CN | 104247061 B | 2/2018 |
| CN | ZL201380018373.5 | 2/2018 |
| CN | 110071196 A | 7/2019 |
| EP | 1 756 879 | 1/2009 |
| EP | 001242234 | 1/2011 |
| EP | 2 438 631 | 4/2012 |
| EP | 2 603 930 | 6/2013 |
| EP | 2 628 196 | 6/2013 |
| EP | 2 438 631 B1 | 4/2019 |
| EP | 2 715 224 B1 | 9/2020 |
| EP | 2 628 196 B1 | 4/2021 |
| JP | 06-291236 | 10/1994 |
| JP | D1102760 | 3/2001 |
| JP | 2001-131517 | 5/2001 |
| JP | 2002-280616 | 9/2002 |
| JP | 2005-179147 | 7/2005 |
| JP | 2005-209763 | 8/2005 |
| JP | 2006-093470 | 4/2006 |
| JP | 2006-093738 | 4/2006 |
| JP | 2006-173561 | 6/2006 |
| JP | 2008-071954 | 6/2006 |
| JP | 2007-108547 | 4/2007 |
| JP | 2007-335762 | 12/2007 |
| JP | 2007-335765 | 12/2007 |
| JP | 2008-072092 | 3/2008 |
| JP | 2008-091792 | 4/2008 |
| JP | 2008-098218 | 4/2008 |
| JP | 2008-103480 | 5/2008 |
| JP | 2008-147611 | 6/2008 |
| JP | 2008-533716 | 8/2008 |
| JP | 2008-545269 | 12/2008 |
| JP | D1346959 | 12/2008 |
| JP | 2009-016636 | 1/2009 |
| JP | 3154368 | 9/2009 |
| JP | 2010-034262 | 2/2010 |
| JP | 2010 199167 A | 9/2010 |
| JP | 2010-205776 | 9/2010 |
| JP | 1416396 | 5/2011 |
| JP | 1431637 | 12/2011 |
| JP | 1433335 | 1/2012 |
| JP | D1433030 | 1/2012 |
| JP | 1441805 | 4/2012 |
| JP | 5459623 B2 | 4/2014 |
| KR | 10-0505838 | 10/2005 |
| KR | 10-0591687 | 6/2006 |
| KR | 1020070000130 A | 1/2007 |
| KR | 10-2007-0055361 | 5/2007 |
| KR | 10-0845856 | 7/2008 |
| KR | 20 2008 0002564 U | 7/2008 |
| KR | 1020090003378 A | 1/2009 |
| KR | 10-0967451 | 7/2010 |
| KR | 30-0613227 | 3/2011 |
| KR | 20 2011 0008161 U | 8/2011 |
| KR | 10-2011-0104336 | 9/2011 |
| KR | 30-0697636 | 6/2013 |
| KR | 10-1578090 | 12/2015 |
| TW | 200711166 | 3/2007 |
| TW | 200843130 A | 11/2008 |
| TW | 200928203 | 7/2009 |
| TW | M376119 U1 | 3/2010 |
| TW | M376909 | 3/2010 |
| TW | 201013969 | 4/2010 |
| TW | M383822 | 7/2010 |
| TW | 100305347 | 3/2012 |
| TW | D146222 | 4/2012 |
| TW | D148144 | 7/2012 |
| TW | I515932 | 1/2016 |
| TW | I560915 | 12/2016 |
| TW | I591866 | 7/2017 |

(56) References Cited

FOREIGN PATENT DOCUMENTS

| WO | WO 2006/059858 | | 6/2006 |
|---|---|---|---|
| WO | WO 2006/095949 | | 9/2006 |
| WO | WO 2007/126720 | | 11/2007 |
| WO | WO 2008/002088 | | 1/2008 |
| WO | WO 2008/021268 | | 2/2008 |
| WO | WO 2008/069204 | | 6/2008 |
| WO | WO 2009/063255 | | 5/2009 |
| WO | WO-2010/020105 | | 2/2010 |
| WO | WO-2010/141215 | | 3/2011 |
| WO | WO 2011/105409 | | 9/2011 |
| WO | WO 2012/005984 | | 1/2012 |
| WO | WO 2012/021238 | | 2/2012 |
| WO | WO 2012/050994 | | 4/2012 |
| WO | WO 2012/100060 | | 7/2012 |
| WO | WO 2012/106312 | | 8/2012 |
| WO | WO 2012/109225 | | 8/2012 |
| WO | WO 2012/109225 | A1 | 8/2012 |
| WO | WO 2012/151270 | | 11/2012 |
| WO | WO 2013/148573 | | 10/2013 |
| WO | WO 2014/093813 | A1 | 6/2014 |
| WO | WO 2015/142537 | A1 | 9/2015 |

OTHER PUBLICATIONS

Taiwanese Office Action and Search Report for Application No. 100126672 dated Dec. 26, 2013.
Chinese Office Action for Application No. 2010800304863 dated Jan. 27, 2014.
Taiwanese Office Action for Application No. 101102722 dated Jan. 28, 2014.
Notice of Allowance for U.S. Appl. No. 13/011,609 dated Feb. 20, 2014.
Corrected Notice of Allowance for U.S. Appl. No. 12/969,267 dated Feb. 27, 2014.
Chinese Office Action for Application No. 201080030486.3 dated Mar. 11, 2014.
Japanese Office Action for Application No. 2013-533875 dated Mar. 11, 2014.
Korean Office Action for Application No. 10-2012-7031924 dated Mar. 17, 2014.
Final Office Action for U.S. Appl. No. 13/019,812 dated Mar. 27, 2014.
Chinese Office Action for Application No. 2012800215676 dated Feb. 29, 2016.
Japanese Appeal Decision for Application No. 2012-04402 dated Apr. 11, 2016.
Korean Office Action for Application No. 10 2013/7031905 dated Sep. 29, 2014.
Chinese Office Action for Application No. 2010/80030486.3 dated Dec. 17, 2014.
Chinese Office Action for Application No. 201280014461.3 dated Jan. 4, 2015.
Chinese Office Action for Application No. 201180029228.8 dated Jan. 12, 2015.
Taiwanese Office Action for Application No. 100137044 dated Feb. 24, 2015.
Chinese Decision to Grant for Application No. 201080030486.3 dated Apr. 1, 2015.
Chinese Office Action for Application No. 201180043373. 1 dated Mar. 2, 2015.
Notice of Allowance for U.S. Appl. No. 13/011,609 dated Apr. 14, 2015.
Notice of Allowance for U.S. Appl. No. 14/094,341 dated Apr. 14, 2015.
Chinese Office Action for Application No. 201180041213.3 dated Apr. 7, 2015.
Restriction Requirement for Application No. 13/367,929 dated May 11, 2015.
Chinese Office Action for Application No. 201210068676.5 dated Feb. 15, 2015.
Taiwanese Office Action for Application No. 101102722 dated Apr. 27, 2015.
Korean Decision of Rejection for Application No. 10-2013-7022968 dated May 27, 2015.
Japanese Notice of Completion of Pretrial Reexamination for Application No. 2013/533875 dated May 20, 2015.
Non-Final Office Action for U.S. Appl. No. 14/174,559 dated Jun. 24, 2015.
Korean Office Action for Application No. 10-2012-7031924 dated Jun. 26, 2015.
Chinese Office Action for Application No. 2011800412133 dated Apr. 15, 2016.
Taiwanese Office Action for Application No. 100137044 dated May 11, 2016.
Chinese Office Action for Application No. 201180043373 dated May 13, 2016.
Appeal Decision for Japanese Application No. 2013-533875 dated Sep. 15, 2015.
Non-Final Office Action for U.S. Appl. No. 13/362,683 dated Jul. 2, 2015.
Chinese Office Action for Application No. 2012800078626 dated May 21, 2015.
Taiwanese Office Action and Search Report for Application No. 101115615 dated Jun. 4, 2015.
Taiwan Notice of Allowance for Application No. 101102722 dated Jul. 25, 2016.
Extended European Search Report for Application No. 11833129 dated Jul. 22, 2016.
Notice of Allowance for U.S. Appl. No. 13/953,438 dated May 13, 2014.
Japanese Office Action for Application No. 2012-513966 dated May 16, 2014.
Final Office Action for U.S. Appl. No. 13/362,683 dated Jun. 5, 2014.
Notice of Allowance for U.S. Appl. No. 13/019,812 dated Jun. 12, 2014.
Taiwanese Office Action for Application No. 100126672 dated Jun. 18, 2014.
Notice of Allowance for U.S. Appl. No. 13/616,759 dated Jul. 2, 2014.
Chinese Office Action for Application No. 201280021567.6 dated Jun. 24, 2016.
Notice of Allowance from U.S. Appl. No. 29/330,657 dated Sep. 25, 2009.
Restriction Requirement for U.S. Appl. No. 29/382,394 dated Jul. 17, 2012.
Notice of Allowance for U.S. Appl. No. 13/082,699 dated Oct. 23, 2012.
Non-Final Office Action for U.S. Appl. No. 13/462,450 dated Jan. 15, 2013.
Non-Final Office Action for U.S. Appl. No. 12/825,075 dated Feb. 1, 2013.
Non-Final Office Action for U.S. Appl. No. 13/227,961 dated Mar. 26, 2013.
Non-Final Office Action for U.S. Appl. No. 12/969,267 dated Mar. 29, 2013.
Notice of Allowance for U.S. Appl. No. 13/082,699 dated Apr. 3, 2013.
Korean Notice of Allowance for Application No. 30-2010-0047049 dated Apr. 4, 2013.
Non-Final Office Action for U.S. Appl. No. 13/011,609 dated Jun. 7, 2013.
Non-Final Office Action for U.S. Appl. No. 13/616,759 dated Jul. 11, 2013.
Notice of Allowance for U.S. Appl. No. 12/825,075 dated Jul. 31, 2013.
Notice of Allowance for U.S. Appl. No. 13/462,450 dated Aug. 1, 2013.
Taiwanese Notice of Allowance for Application No. 100126672 dated Aug. 26, 2015.
"DuPont Ti-Pure titanium dioxide, Titanium Dioxide for Coatings," Jan. 2012, pp. 1-28, DuPont, USA.

(56) References Cited

OTHER PUBLICATIONS

"Technical Guide, Reflectance Materials and Coatings," Jan. 2012, pp. 1-26, Labsphere, USA.
"Thick-Film Ceramic Substrates Design Guide," Mar. 2012, pp. 1-16, CoorsTek, Colorado, USA.
Non-Final Office Action for U.S. Appl. No. 13/435,912 dated Jan. 11, 2013.
Notice of Allowance for U.S. Appl. No. 13/435,912 dated Jun. 19, 2013.
International Search Report and Written Opininon for Application No. PCT/US2013/033704 dated Jun. 26, 2013.
Restriction Requirement for U.S. Appl. No. 13/436,247 dated Aug. 1, 2013.
Taiwanese Office Action for Application No. 100137044 dated Jul. 16, 2014.
Chinese Office Action for Application No. 201180041213.3 dated Aug. 4, 2014.
Chinese Office Action for Application No. 201080030486.3 dated Sep. 3, 2014.
Korean Office Action for Application No. 10-2013-7022968 dated Sep. 19, 2014.
Chinese Office Action for Application No. 201280021567.6 dated Aug. 25, 2015.
Chinese Office Action for Application No. 201280014461.3 dated Sep. 16, 2015.
Non-Final Office Action for U.S. Appl. No. 13/362,683 dated Sep. 9, 2013.
Notice of Allowance for U.S. Appl. No. 29/432,988 dated Sep. 10, 2013.
Restriction Requirement for U.S. Appl. No. 29/451,761 dated Sep. 25, 2013.
Notice of Allowance for U.S. Appl. No. 13/227,961 dated Oct. 2, 2013.
Notice of Allowance for U.S. Appl. No. 12/969,267 dated Oct. 2, 2013.
Non-Final Office Action for U.S. Appl. No. 13/616,759 dated Oct. 10, 2013.
Notification Concerning Availability of the Publication Serial No. PCT/US2012/024122 dated Aug. 16, 2012.
Certificate of Design Patent for Chinese Application Serial No. CN ZL 201130171313 dated May 7, 2012.
Certificate of Design Patent for Application Serial No. CN ZL 201130210595 dated Jun. 11, 2012.
Certificate of Design Patent for Application Serial No. CN ZL 201030577293 dated Jun. 11, 2012.
International Search Report for Application Serial No. PCT/US2012/023285 dated Jun. 27, 2012.
International Search Report and Written Opinion for Application Serial No. PCT/US2012/024122 dated Jul. 11, 2012.
Korean Office Action for Application Serial No. KR 30-2010-0047048 dated Dec. 15, 2011.
Korean Office Action for Application Serial No. KR 30-2010-0047049 dated Dec. 15, 2011.
Korean Office Action for Application Serial No. KR 30-2011-27243 dated Jul. 5, 2012.
Korean Office Action for Application Serial No. KR 30-2011-27244 dated Jul. 5, 2012.
Korean Office Action for Application Serial No. KR 30-2011-27245 dated Jul. 5, 2012.
International Search Report and Written Opinion for Application Serial No. PCT/US2012/021879 dated Sep. 21, 2012.
International Search Report and Written Opinion for Application Serial No. PCT/US2012/036110 dated Oct. 4, 2012.
Notification Concerning Availability of the Publication Serial No. PCT/US2012/023285 dated Aug. 9, 2012.
Korean Office Action for Application Serial No. KR 30-2010-0047049 dated Sep. 12, 2012.
Hyun-Ho Kim et al., Thermal Transient Characteristics of Die Attach in High Power LED PKG, Microelectronics Reliability, vol. 48, Issue 3, Mar. 2008, pp. 445-454.
Advisory Action for U.S. Appl. No. 13/362,683 dated Oct. 16, 2014.
Korean Office Action for Application No. 10-2012-7031924 dated Oct. 27, 2014.
Notice of Allowance for U.S. Appl. No. 13/011,609 dated Oct. 28, 2014.
Non-Final Office Action for U.S. Appl. No. 14/094,341 dated Oct. 31, 2014.
Japanese Decision of Rejection for Application No. 2012-513966 dated Oct. 31, 2014.
Non-Final Office Action for U.S. Appl. No. 14/174,559 dated Dec. 5, 2014.
Korean Notice of Allowance for Application No. 10-2012-7031924 dated Sep. 23, 2015.
Chinese Office Action for Application No. 2011800412133 dated Oct. 19, 2015.
Chinese Office Action for Application No. 201180043373.1 dated Nov. 12, 2015.
Taiwanese Notice of Allowance for Application No. 100305347 dated Mar. 23, 2012.
Korean Decision to Grant for Application No. KR 30-2011-0027245 dated Nov. 19, 2012.
Korean Decision to Grant for Application No. KR 30-2011-0027244 dated Nov. 19, 2012.
Korean Decision to Grant for Application No. KR 30-2011-0027243 dated Nov. 26, 2012.
Korean Decision to Grant for Application No. KR 30-2010-0047048 dated Nov. 26, 2012.
Notice of Allowance for U.S. Appl. No. 29/382,394 dated Nov. 27, 2012.
Supplemental Notice of Allowance for U.S. Appl. No. 29/382,394 dated Jan. 14, 2013.
Taiwanese Office Action and Search Report for Application No. 101102722 dated Oct. 23, 2014.
Japanese Decision of Rejection for Application No. 2013-533875 dated Nov. 25, 2014.
Extended European Search Report for Application No. EP 10 78 3782 dated Nov. 22, 2013.
Restriction Requirement for U.S. Appl. No. 13/953,438 dated Dec. 5, 2013.
Japanese Office Action for Application No. 2012-513966 dated Dec. 9, 2013.
Notice of Allowance for U.S. Appl. No. 29/451,761 dated Dec. 11, 2013.
Description Model No. NS6x083x issued by Nichia Corporation—at least as early as Feb. 17, 2007.
Description Model No. NS6G083 issued by Nichia Corporation—at least as early as Aug. 31, 2007.
Non-Final Office Action for U.S. Appl. No. 12/479,318 dated Jun. 2, 2010.
U.S. Appl. No. 12/853,812, filed Aug. 10, 2010.
U.S. Appl. No. 61/404,985, filed Oct. 13, 2010.
Non-final Office Action for U.S. Appl. No. 12/479,318 dated Nov. 10, 2010.
U.S. Appl. No. 12/969,267, filed Dec. 15, 2010.
Related Design U.S. Appl. No. 29/382,394, filed Jan. 3, 2011.
International Search Report/Written Opinion dated Jan. 5, 2011 for PCT/US2010/035379.
Certificate of Registration for Community Design Application Serial No. 001283600-0001-0003 dated Jan. 7, 2011.
U.S. Appl. No. 13/011,609, filed Jan. 21, 2011.
Notice of Allowance for Japanese Design Appl. No. 2010-026186 dated Mar. 29, 2011.
Japanese Office Action for JP2010-026185 dated Apr. 5, 2011.
Taiwanese Office Action for Appl. No. 099305566 dated Jul. 12, 2011.
Office Action with Restriction/Election Requirement for U.S. Appl. No. 12/853,812 dated Sep. 22, 2011.
International Search Report and Written Opinion for PCT Application Serial No. PCT/US2011/41833 dated Oct. 24, 2011.
International Search Report and Written Opinion for PCT Application Serial No. PCT/US2011/043539 dated Oct. 28, 2011.
Notice of Allowance for Japanese Application Serial No. JP-DES 2011/015199 dated Nov. 10, 2011.

(56) References Cited

OTHER PUBLICATIONS

Notice of Allowance for Japanese Application Serial No. JP-DES 2011/015200 dated Nov. 30, 2011.
Notice of Allowance for Japanese Application Serial No. JP-DES 2011/015201 dated Nov. 30, 2011.
Notice of Allowance for Taiwanese Application Serial No. TW 099305566 dated Dec. 5, 2011.
Notice of Allowance for Chinese Application Serial No. CN 2011/30171313.0 dated Dec. 6, 2011.
Non-Final Office Action for U.S. Appl. No. 12/853,812 dated Dec. 7, 2011.
International Preliminary Report on Patentability for PCT Application Serial No. PCT/US2010/035379 dated Dec. 8, 2011.
Notice of Allowance for U.S. Appl. No. 29/397,017 dated Dec. 9, 2011.
Non-Final Office Action for Korean Application Serial No. KR 30-2010-0047048 dated Dec. 15, 2011.
Non-Final Office Action for Korean Application Serial No. KR 30-2010-0047049 dated Dec. 15, 2011.
Notification of Grant for Chinese Application Serial No. CN 2011/30210595.0 dated Jan. 17, 2012.
Notification of Grant for Chinese Application Serial No. CN 2010-305787293.2 dated Jan. 19, 2012.
Notice of Allowance for U.S. Appl. No. 29/401,692 dated Jan. 20, 2012.
Notice of Allowance for U.S. Appl. No. 29/403,433 dated Feb. 2, 2012.
International Search Report for Application Serial No. TW 100305347 dated Mar. 5, 2012.
Japanese Notice of Allowance for Application Serial No. JP 2011-017747 dated Mar. 13, 2012.
Communication of European publication number and information on the application of Article 67(3) EPC dated Mar. 14, 2012.
Non-Final Office Action for U.S. Appl. No. 13/082,699 dated Apr. 13, 2012.
Notice of Allowance for U.S. Appl. No. 29/397,017 dated May 17, 2012.
Notice of Allowance for U.S. Appl. No. 12/853,812 dated May 21, 2012.
International Search Report and Written Opinion for Application Serial No. PCT/US2011/054560 dated May 22, 2012.
Supplemental Notice of Allowance for U.S. Appl. No. 29/397,017 dated Jul. 23, 2012.
International Search Report and Written Opininon for Application No. PCT/US2013/074998 dated Apr. 3, 2014.
Restriction Requirement for U.S. Appl. No. 13/836,940 dated Jun. 17, 2014.
Non-Final Office Action for U.S. Appl. No. 13/836,709 dated Sep. 30, 2014.
Non-Final Office Action for U.S. Appl. No. 13/836,940 dated Oct. 7, 2014.
International Search Report for Application No. PCT/US 2015/018964, dated Jan. 9, 2015.
Final Office Action for U.S. Appl. No. 13/836,709 dated Apr. 9, 2015.
Final Office Action for U.S. Appl. No. 13/836,940 dated Apr. 17, 2015.
Advisory Action for U.S. Appl. No. 13/836,709 dated Jun. 23, 2015.
Non-Final Office Action for U.S. Appl. No. 13/836,940 dated Sep. 11, 2015.
Final Office Action for U.S. Appl. No. 13/362,683 dated Jan. 22, 2016.
Final Office Action for U.S. Appl. No. 13/836,940 dated Feb. 16, 2016.
Chinese Office Action for Application No. 2013800183735 dated May 18, 2016.
Non-Final Office Action for U.S. Appl. No. 13/836,940 dated Jul. 21, 2016.
Taiwanese Office Action for Application No. 100137044 dated Aug. 26, 2016.
Chinese Office Action for Application No. 201180043373 dated Sep. 12, 2016.
Non-Final Office Action for U.S. Appl. No. 13/362,683 dated Oct. 4, 2016.
Chinese Notice of Allowance for Application No. 201280021567 dated Dec. 28, 2016.
Chinese Office Action for Application No. 2013800183735 dated Jul. 12, 2017.
Supplemental Notice of Allowance for U.S. Appl. No. 13/836,709 dated Jul. 31, 2017.
Notice of Allowance for Taiwanese Application No. 100137044 dated Mar. 30, 2017.
European Office Action for Application No. 10783782 dated Apr. 5, 2017.
Notice of Allowance for U.S. Appl. No. 13/836,940 dated May 18, 2017.
Final Office Action for U.S. Appl. No. 13/362,683 dated Jun. 5, 2017.
Decision of Rejection for Chinese Application No. 201180043373 dated Jun. 8, 2017.
Notice of Allowance for U.S. Appl. No. 13/836,940 dated Jul. 18, 2017.
Notice of Allowance for U.S. Appl. No. 13/362,683 dated Aug. 23, 2017.
Corrected Notice of Allowability for U.S. Appl. No. 13/362,683 dated Oct. 16, 2017.
Notice of Issuance for Chinese Application No. 201380018373 dated Nov. 13, 2017.
Notice of Reexamination for Chinese Application No. 201180043373 dated Mar. 29, 2018.
European Office Action for Application No. 10-783-782.5-1211 dated May 30, 2018.
First Search for Chinese Application No. 201180029228.8 dated Oct. 20, 2014; retrieved from Global Dossier on Feb. 26, 2019.
Korean Office Action for Application No. 10-2013-7031905 dated Nov. 27, 2014.
Report of Reconsideration by Examiner before Appeal for Japanese Application No. 2012-513966 dated Mar. 19, 2015.
Report of Reconsideration by Examiner before Appeal for Japanese Application No. 2013-533875 dated May 20, 2015.
Chinese Office Action for Application No. 2012800149123 dated Jul. 24, 2015.
Korean Office Action for Application No. 10-2013-7031905 dated Jul. 28, 2015.
Chinese Office Action for Application No. 201180029228.8 dated Sep. 16, 2015.
Chinese Office Action for Application No. 201210068676.5 dated Oct. 13, 2015.
European Search Report for Application No. 11816752.7 dated Feb. 26, 2016.
European Office Action for Application No. 11833129.7 dated Apr. 5, 2019.
European Office Action for Application No. 11833129.7 dated Dec. 3, 2019.
Chinese Office Action for Application No. 201811517972.2 dated Jan. 28, 2021.
Chinese Notice of Allowance for Application No. 201180041213 dated Sep. 5, 2016.
Notice of Allowance for U.S. Appl. No. 14/961,439 dated Mar. 30, 2017.

\* cited by examiner

COMPONENTS AND METHODS FOR LIGHT EMITTING DIODE (LED) LIGHTING

CROSS REFERENCE TO RELATED APPLICATION

This application relates and claims priority to U.S. provisional patent application 61/440,204, filed Feb. 7, 2011.

TECHNICAL FIELD

The subject matter disclosed herein relates generally to components, modules, and methods for light emitting diode (LED) lighting. More particularly, the subject matter disclosed herein relates to components and methods for increasing brightness extracted from light emitter devices, such as light emitting diodes (LEDs) or LED chips.

BACKGROUND

Optoelectronic devices utilizing light emitters or light emitter devices, such as light emitting diodes (LEDs) or LED chips, have various applications in consumer electronics. One or more high brightness LED chips, for example, can be packaged within surface mount device (SMD) housings for use as light sources in space-limited applications where thermal management and size can be important. Some high brightness LED chips can be housed in plastic, leaded chip carriers (PLCCs) or in or on ceramic-based housings or substrates, for example, housings comprising low temperature co-fired ceramic (LTCC) materials or high temperature co-fired ceramic (HTCC) materials. The LED chips and/or LED housings can be improved for display backlighting and illumination in automotive, signage, architectural, personal, and general-illumination applications. Typical end-products for LED chips packaged within SMD housings include, but are not limited to, LED light bulbs, commercial/residential directional lighting, general indoor/outdoor illumination, commercial displays, indoor cabinet displays, flashes for cameras, retail and window displays, emergency lighting and signs, household appliances, and television and automotive instrument panels.

One area of improvement of LED components includes the increasing amount of light, or brightness, extracted per package. Packages for high brightness LED chips can incorporate various design features for increasing the amount of light extracted per LED chip. Design features for increasing package brightness can include, for example, the type of phosphor(s) used, the method of bonding LED chips, and/or the selection of reflective materials surrounding the LED chips within the housing. Other areas of improvement for LED components includes incorporation of design features which improve, for example, thermal properties and/or minimizing overall size, or footprint, of SMD housings to efficiently utilize space when mounted to an external source. To date, a package comprising an improved recess to package ratio has not been appreciated in the art.

Consequently, there remains a need for improved light emitter device components, modules and methods that overcome or alleviate shortcomings of the prior art light emitter device components, modules and methods.

SUMMARY

In accordance with this disclosure, light emitting diode (LED) packages, modules and methods are provided. It is, therefore, an object of the present disclosure to provide light emitter device components, modules and methods improving light extraction and thermal efficiency.

These and other objects as can become apparent from the disclosure herein are achieved, at least in whole or in part, by the subject matter described herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1A:
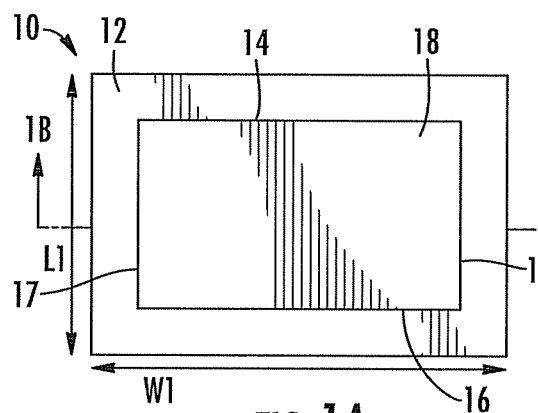
FIGS. 1A and 1B illustrate top and side views, respectively, of a light emitter device component according to the prior art.

Reference will now be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left of" the other structures or portions. Like numbers refer to like elements throughout.

Unless the absence of one or more elements is specifically recited, the terms "comprising," including," and "having" as used herein should be interpreted as open-ended terms that do not preclude the presence of one or more elements.

Light emitters or light emitting devices according to embodiments described herein can comprise group III-V nitride (e.g., gallium nitride (GaN)) based light emitting diode (LED) chips or lasers that can be fabricated on a growth substrate, for example, a silicon carbide (SiC) substrate, such as those devices manufactured and sold by Cree, Inc. of Durham, N.C. Other growth substrates are also contemplated herein, for example and not limited to sapphire, silicon (Si) and GaN. In one aspect. SIC substrates/layers can be 4H polytype silicon carbide substrates/layers. Other Sic candidate polytypes, such as 3C, 6H, and 15R polytypes, however, can be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. Nos. 4,946,547; and 5,200,022, the disclosures of which are incorporated by reference herein in their entireties. Any other suitable growth substrates are contemplated herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa1-xN$ where $1>x>0$ are often used to describe these compounds. Techniques for epitaxial growth of Group III nitrides have become reasonably well developed and reported in the appropriate scientific literature.

Although various embodiments of LED chips disclosed herein comprise a growth substrate, it will be understood by those skilled in the art that the crystalline epitaxial growth substrate on which the epitaxial layers comprising an LED chip are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

Group III nitride based LEDs or LED chips according to some embodiments of the present subject matter, for example, can be fabricated on growth substrates (e.g., Si, SiC, or sapphire substrates) to provide horizontal devices (with at least two electrical contacts on a same side of the LED chip) or vertical devices (with electrical contacts on opposing sides of the LED). Moreover, the growth substrate can be maintained on the LED after fabrication or removed (e.g., by etching, grinding, polishing, etc.). The growth substrate can be removed, for example, to reduce a thickness of the resulting LED chip and/or to reduce a forward voltage through a vertical LED chip. A horizontal device (with or without the growth substrate), for example, can be flip chip bonded (e.g., using solder) to a carrier substrate or printed circuit board (PCB), or wire bonded. A vertical device (with or without the growth substrate) can have a first terminal solder bonded to a carrier substrate, mounting pad, or PCB and a second terminal wire bonded to the carrier substrate, electrical element, or PCB. Examples of vertical and horizontal LED chip structures are discussed by way of example in U.S. Publication No. 2008/0258130 to Bergmann et al. and in U.S. Publication No. 2006/0186418 to Edmond et al., the disclosures of which are hereby incorporated by reference herein in their entireties.

One or more LED chips can be at least partially coated with one or more phosphors. The phosphors can absorb a portion of the LED chip light and emit a different wavelength of light such that the LED device or package emits a combination of light from each of the LED chip and the phosphor. In one embodiment, the LED device or package emits what is perceived as white light resulting from a combination of light emission from the LED chip and the phosphor. One or more LED chips can be coated and fabricated using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference in their entireties. Other suitable methods for coating one or more LED chips are described in U.S. patent application Ser. No. 12/014,404 entitled "Phosphor Coating Systems and Methods for Light Emitting Structures and Packaged Light Emitting Diodes Including Phosphor Coating" and the continuation-in-part application U.S. patent application Ser. No. 12/717,048 entitled "Systems and Methods for Application of Optical Materials to Optical Elements", the disclosures of which are hereby incorporated by reference herein in their entireties. LED chips can also be coated using other methods such electrophoretic deposition (EPD), with a suitable EPD method described in U.S. patent application Ser. No. 11/473,089 entitled "Close Loop Electrophoretic Deposition of Semiconductor Devices", which is also incorporated herein by reference in its entirety. It is understood that LED devices, systems, and methods according to the present subject matter can also have multiple LED chips of different colors, one or more of which can be white emitting. As understood by those of skill in the art, an encapsulant can be used, such as by dispensing, in association with an LED component or substrate to cover one or more of the LED chips. In this case, any suitable type and color of phosphor can be added to the encapsulant in order to achieve desired light output of a desired color. This type use of phosphor can be instead of or in addition to any phosphor coating of the one or more LED chips.

Figure 1B:
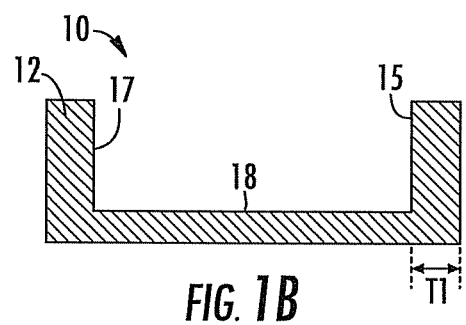

Embodiments of the present subject matter will be described with reference to FIGS. 1-11B. FIGS. 1A to 3B illustrate a housing body of light emitter device components or LED components. Discussion of other elements comprising the LED component is set forth below. Referring now to FIGS. 1A and 1B. FIG. 1A illustrates a top view of a conventional LED component 10 comprising a package body 12 having a recess therein defined by one or more inner walls. FIG. 1A illustrates a substantially symmetric recess formed by inner walls 14, 15, 16, and 17. FIG. 1B illustrates a side view of FIG. 1A wherein inner walls 15 and 17 are substantially straight without any noticeable curvature from the top of the LED component body 12 to a mounting surface 18. One or more LED chips (not shown) may be mounted upon the mounting surface 18. Inner walls 14, 15, 16, and 17 of this conventional LED component body 12 are of a uniform thickness T1 from the top of the package body 12 to the mounting surface 18. As known in the art, wall thicknesses, for example, T1 can typically form having an arbitrary thickness which can vary during processing. To date, thickness of the wall in conventional LED components, for example, LED component 10 having a wall thickness of T1 fail to comprise a calculated and deliberate wall thickness which can increase the amount of light extracted per LED component. A desirable design factor, discussed more in detail below, which can increase the amount of light extracted per LED component is maximizing the opening of the package recess, in other words, minimizing the amount of surface area outside of the recess to below a threshold ratio of the overall surface area. Maximizing the opening of the package recess can increase the amount of surface area inside of the recess which becomes available to reflect light from one or more LED chips (not shown). As stated earlier, maximizing the surface area inside of the recess comprises minimizing the surface area outside of the recess, and this in turn can improve the amount of light that can be extracted per LED component. The area outside of the recess can be calculated by multiplying the length L1 and width W1 of the LED component body 12 and subtracting the length and width of the recess, that is, the product of the length of inner walls 15 and 16 forming the recess. An improved ratio for surface area outside of the recess, as discussed further below, is approximately less than or equal to 0.25 or twenty-five percent (25%) of the overall surface area of the package. The conventional package illustrated by FIGS. 1A and 1B comprising the arbitrary wall thickness of T1 does not illustrate a package wherein the surface area outside of the recess has been minimized at or below the improved threshold ratio of 0.25.

Figure 2A:
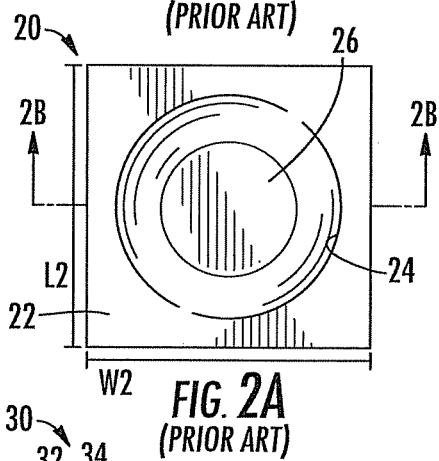
FIGS. 2A and 2B illustrate top and side views, respectively of a light emitter device component according to the prior art.
Figure 2B:
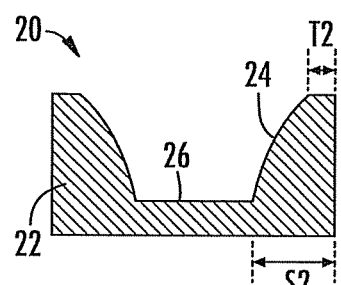

Referring to FIGS. 2A and 2B, FIG. 2A illustrates a top view of a conventional LED component 20 comprising a package body 22 with a recess defined therein by inner wall 24. Inner wall 24 comprises a continuous and substantially symmetrically round circle formed about a mounting surface 26 upon which one or more LED chips (not shown) may be mounted. As illustrated by FIG. 2B, inner wall 24 is substantially curved, or arched, from the top of package body 22 to mounting surface 26. Inner wall 24 varies in thickness along its curved wall from a first thickness T2 to a second, total sidewall thickness S2 wherein S2 is substantially thicker than T2. The surface area outside of the recess is calculated by multiplying length L2 by width W2 and subtracting the surface area defined by the circular recess. The surface area outside of the recess can be minimized when the opening of the recess is such that the surface area outside is less than or equal to a threshold ratio of 0.25, or approximately 25% of the surface area of the top of the package body. This number, in turn, can improve the amount of light that can be extracted per LED component. FIGS. 2A and 2B comprising the arbitrary sidewall thickness of S2 which does not illustrate a package having a maximized opening of the recess, wherein the surface area outside of the recess has been minimized at or below the improved threshold ratio of 0.25.

Figure 3A:
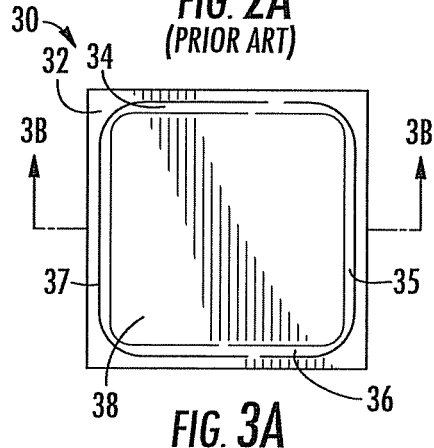
FIGS. 3A and 3B illustrate top and side views, respectively of a light emitter device component according to the present subject matter.
Figure 3B:
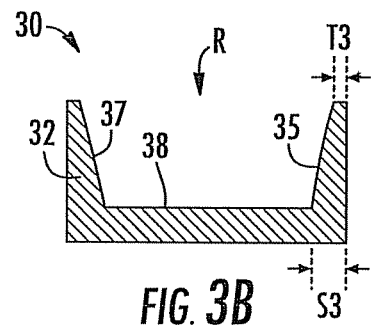

Referring now to FIGS. 3A to 3D, improved packages in which surface area outside of a recess has been minimized are illustrated. That is, packages having improved recesses are shown. The surface area outside of the recess can be optimally minimized when it is less than or equal to a threshold ratio of 0.25 of the overall surface area or 25% of the top surface area of the package. Stated differently, the recess opening can be maximized when it is greater than or equal to a threshold ratio of 0.75, or 75%, of the top surface area of the package. This can be accomplished, for example, in part by maximizing the opening of a recess defined in the package. For example, FIGS. 3A and 3B illustrate a light emitter device component or LED component 30 which comprises a package body 32. Package body 32 comprises a recess generally designated R defined therein that can be defined by substantially symmetric inner walls 34, 35, 36, and 37. Inner walls 34 to 37 can connect forming squared corners or rounded corners as shown. Optionally, the recess may comprise a substantially circular inner wall wherein the opening of the recess can be maximized to reduce surface area of the package outside of the recess to at or below a threshold ratio. Inner walls 34 to 37 can be formed such that they form a straight line from a top of the package body 32 to the mounting surface 38 thereby having a uniform thickness, or the walls can curve, or substantially slope towards mounting surface 38. For example, as the cross-section in FIG. 3B illustrates, inner walls 37 and 35 comprise an opening having uniform thickness T3 beginning at the top of LED component body 32 and inner walls 37 and 35 gently slope towards the mounting surface 38 to a final sidewall thickness S3. Recess R can comprise a maximized recess opening which can be surrounded by a thin outer rim of surface area of the package having thickness T3. The surface area outside of this recess can be decreased when it reaches a threshold ratio of less than or equal to 0.25, or 25% of the overall surface area of LED component 30. LED component 30 of FIGS. 3A and 3B illustrate a package which has the recess area improved for light extraction by minimizing the surface area outside of the recess at or below the improved threshold ratio of 0.25.

Figure 3C:
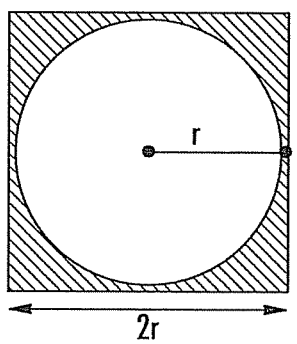
FIGS. 3C and 3D illustrate top views of representative light emitter device components according to the present subject matter.
Figure 3D:
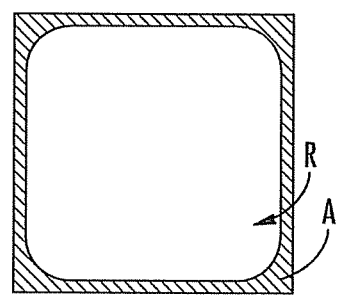

The calculation of a package wherein the recess opening is maximized to provide optimal light extraction is illustrated by FIGS. 3C and 3D. As illustrated by FIG. 3C, the ratio of a circle having a radius, r, that is aligned within a square having a length and width of 2r. In FIG. 3C, the circle represents the opening of the recess within the body of an LED component. The optimal ratio of the circle within the square as illustrated by FIG. 3C is 0.21, see Formula (I) below.

$$[\text{Shaded area, } A/\text{Area of square}] = [(\text{Area of square} - \text{Area of circle})/(\text{Area of square})] = [(4r^2 - \pi r^2/(4r^2)] = [(4-\pi)/4] = 0.21 \quad (1)$$

Recess R may have square or rounded corners or may be substantially circular as illustrated by FIG. 3C. As calculated by Formula (I) above, an ideal circle within a square provides a ratio of 0.21. In reality, however, a conventional circular recess does not extend completely to the edges. To obtain a package wherein the surface area outside of the recess is less than or equal to a threshold ratio of 0.25, that is, 25% of the overall surface area, the recess should have an opening where the surface area surrounding the opening is as small, that is, as thin as possible. For example, FIG. 3D illustrates a package body similar to FIG. 3A described above. The packages in 3A and 3D have a surface area outside of the recess which is less than or equal to the threshold ratio of 0.25 or 25% of the surface area of the overall package. The package comprises recess R and the surface area outside of the package represented by the shaded area A. Area A can be minimized by forming a recess such that the opening of the recess can be as large as possible. When area A comprises less than 25% of the surface area of the package, the area inside of the recess is maximized. With a maximized recess, the surfaces available to reflect light are thereby increased, which in turn increases overall light extraction, or brightness, per LED component.

Figure 4:
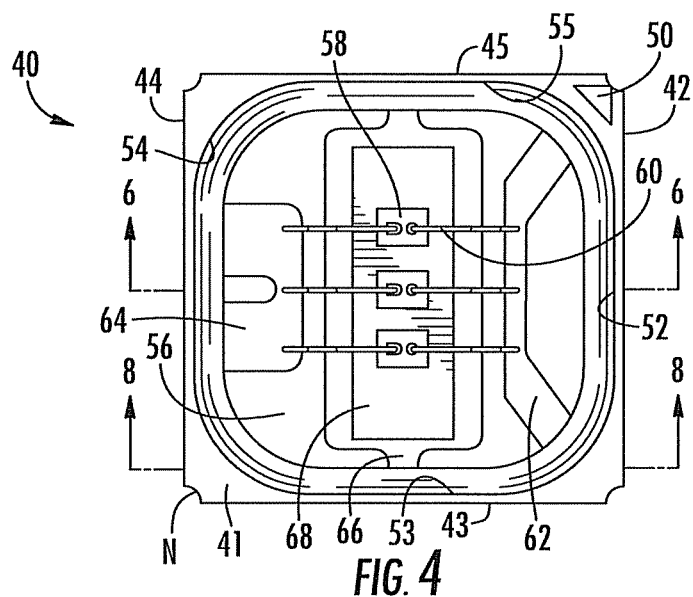
FIG. 4 illustrates a top view of a light emitter device component according to the present subject matter.
Figure 5:
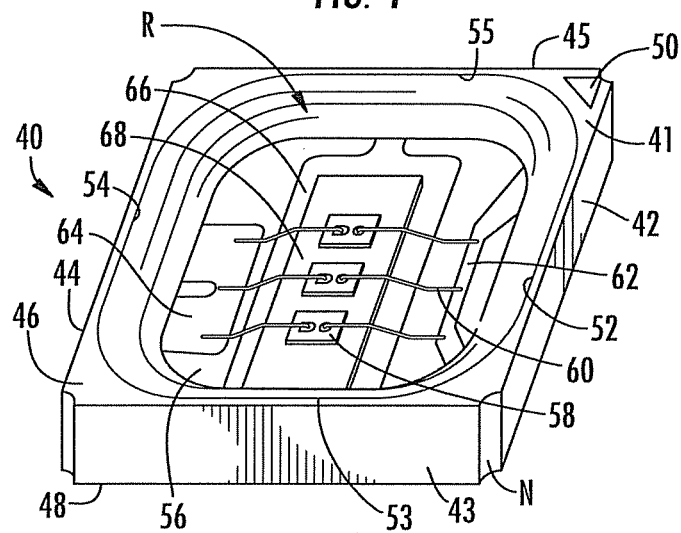
FIG. 5 illustrates a perspective view of a light emitter device component according to the present subject matter.

Referring now to FIGS. 4 to 10, a light emitter device component can comprise a recess that can be defined by walls forming a maximum opening. FIGS. 4 and 5 illustrate a light emitter package or LED component, generally designated 40, comprising a package body 41 formed by outer walls 42, 43, 44, and 45. Package body 41 can comprise any material known in the art. For example, body 41 can comprise molded plastic, ceramic, thermoset, silicone and/or thermoplastic materials or any combination of these or other materials. In one aspect, body 41 comprises a ceramic body cast using low temperature co-fired ceramic (LTCC) materials and processes. Ceramic materials can be selected for use in LED components because of desirable thermal management properties. For example, ceramic materials have low thermal resistance, low moisture sensitivity, superior reliability at high temperature environments, and the superior ability to dissipate heat. LTCC can be favorable for use with for housings that incorporate metal layers to be co-fired within. In another aspect, HTCC can be used. Metals layers and sidewalls can be added to the ceramic body.

Outer walls 42 to 45 of LED component 40 can, for example only and without limitation, form a substantially square body 41. The shape can also be any other shape or configuration, such as a rounded shape or configuration. Outer walls 42 to 45 can comprise one or more notches N at the corners of body 41. LED component 40 can comprise a top surface 46 and a bottom surface 48. One corner of LED component 40 can comprise a mark 50 for identifying electrical characteristics for a particular side of LED component 40. For example, mark 50 can designate the side of the component comprising the anode or cathode.

LED component 40 can further comprise one or more inner walls defining a recess generally designated R. Here, inner walls 52, 53, 54 and 55 define recess R within body 41. Inner walls 52 to 55 can comprise substantially squared or rounded corners where the inner walls meet. Optionally, component 40 may comprise a single inner wall defining a substantially circular recess therein. Inner walls 52 to 55 can be deliberately formed within body 41 to comprise an opening wherein the ratio of the opening to the surface area of top surface 46 is greater than or equal to a threshold ratio of 0.25 of the overall surface area. Stated differently, the surface area of top surface 46 which is located outside of the recess can be less than or equal to the threshold ratio of 0.25, or 25%, of the overall surface area of the component. As discussed above and in one aspect for example only and without limitation, a perfectly aligned circular recess within a square body can produce a ratio of 0.21, that is, 21% of the surface area of the square remains outside of the circle. Here, the LED component 40 can be such that the surface area of the top surface 46 outside of the recess can range from a range of 0.21 to 0.25. Optionally, inner walls 52 to 55 can be coated with a reflective material, such as silver, to further increase the amount of light extracted per LED component 40.

Recess R formed by inner walls 52 to 55. One or more light emitters such as LEDs or LED chips 58 can mount to or be disposed above lower surface 56. An LED chip 58 can mount upon one or more intervening layers as shown for example in FIG. 6A, or alternatively an LED chip can mount directly upon lower surface 56 without any intervening layer or layers as shown for example in FIG. 6B. Lower surface 56 of LED component 40 can comprise a first electrical component 62 and a second electrical component 64. The one or more LED chips 58 can electrically connect to first and second electrical components 62 and 64 using conductive wires 60 formed using a wirebonding process. One of the first and second electrical components 62 and 64 serves as a cathode and the other as anode for supplying the LED chips 58 with current to illuminate an active layer within the LED chip. Alternatively, the LED chips 58 may be flip-chip bonded to the first and second electrical components. Any other suitable bonding techniques could be used as well.

LED component 40 can further comprise a thermal component 66. Thermal component 66 can assist with managing thermal properties of the LED component 40 by spreading and conducting heat away from the one or more LED chips 58. Thermal component 66, first electrical component 62, and second electrical component 64 can comprise a conductive material, for example, silver metal, which can be screen-printed in a single layer on the body 41 during formation of the LED component 40. Thermal component 66 can comprise one or more additional layers 68 to further improve heat spreading and thermal management capabilities of the LED component 40. Using HTCC or any other suitable thermally conducting substrate may reduce any need to use added thermal components such as 66, 70, 72, and/or 74 described further herein.

Figure 6A:
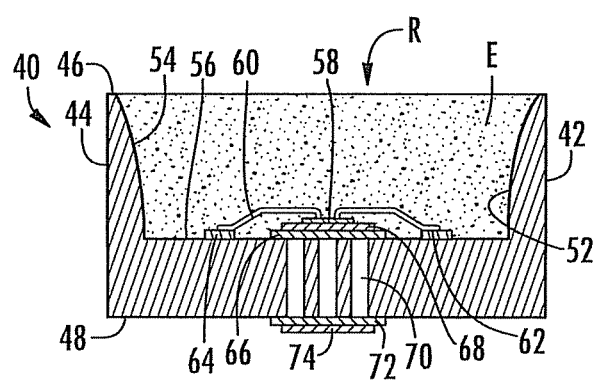
FIG. 6A illustrates a cross-sectional view of a light emitter device component along line 6-6 of FIG. 4.

Referring now to the cross-sectional view of FIG. 6A, taken along line 6-6 of FIG. 4, features of LED component 40 are further illustrated. In this view recess R is defined by inner and outer walls 52, 54, 42, and 44, respectively. The opening of recess R can be as large as possible without extending all the way to the edge of the outer walls 42 and 44, but wherein the surface area of the top surface 46 outside of recess R is less than or equal to a threshold ratio of 0.25, or 25% of the overall top surface area. Stated differently, the recess opening can be greater than or equal to a threshold ratio of 0.75 or 75% of the overall top surface area of the component. Encapsulant E can be disposed within the recess, and can contain one or more phosphors such that light emitted from the one or more LED chips 58 produces an emission of a desired wavelength. Encapsulant E, with or without phosphor included or later added, can be filled to any level within recess R, for example, flush with the top surface 46 of LED component 40.

One or more LED chips 58 can electrically connect to first and second electrical components 62 and 64, respectively by wirebonding using electrically conductive wire 60. LED chips 58 can mount within recess R upon one or more thermal components 66 comprising one or more conductive layers 68. A first patterned layer, top conductive pattern 90 (FIG. 9) can comprise a screen-printed or otherwise deposited layer and can comprise thermal component 66 and first and second electrical components 62 and 64 having a uniform thickness. One or more intervening layers such as, for example, conductive layer 68, can then be deposited by any means know in the art upon the thermal and/or electrical components.

Figure 7:
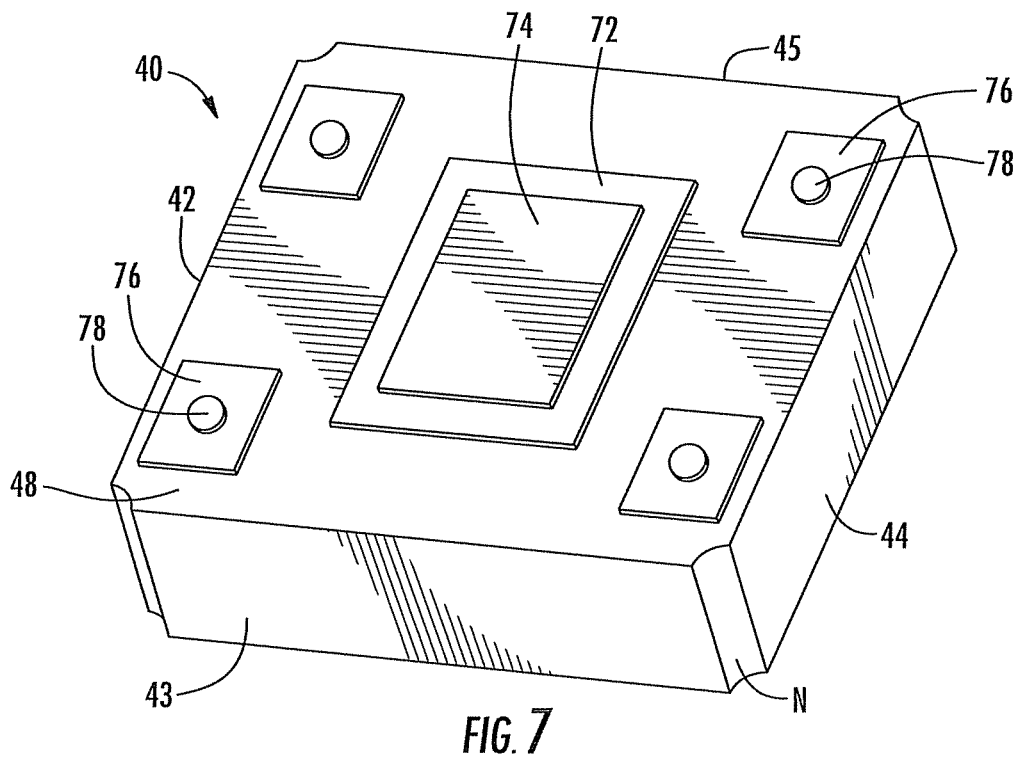
FIG. 7 illustrates a bottom perspective view of a light emitter device component according to the present subject matter.

At least one conductive thermal via 70 can be disposed, or buried, within body 41 and further disposed between thermal element 66 and a thermal pad 72 extending from bottom surface 48 of LED component 40. FIG. 7 illustrates the bottom of LED component 40 as described further below. Thermal pad 72 further spreads the heat dissipated from LED component 40 and conducts the heat into an external heat sink. Thermal pad 72 can comprise any suitable shape, size, and/or geometry known in the art. In one aspect, multiple conductive thermal vias 70 can be used to dissipate the heat released from the one or more LED chips 58. Conductive thermal vias 70 can conduct heat away from LED component 40 by causing heat to flow on a path out from the one or more LED chips 58, into to thermal element 66 and any intervening layers, such as 68, through body 41, out from thermal pad 72, and into an external heat sink (not shown). The external heat sink can comprise a printed circuit board (PCB) or other external element upon to which the LED component 40 may thermally and electrically connect. Conductive thermal vias 70 can comprise any thermally conductive material known in the art, for example silver metal, which can assist in minimizing junction temperature difference between the LED chip(s) and the external sink, thus prolonging the life of LED component 40.

Figure 6B:
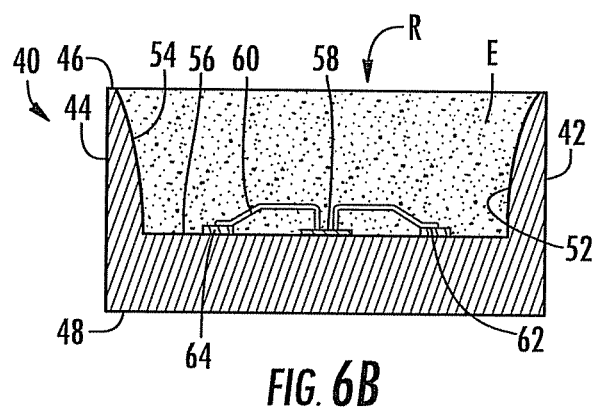
FIG. 6B illustrates a cross-sectional view of another embodiment of the light emitter device component.

As shown for example and without limitation in FIG. 6B, one or more LED chip 58 can mount within recess R directly upon lower surface 56 without any intervening layer. As one example, LED chip 58 can be mounted directly upon lower surface 56 without an intervening layer or structure such as thermal component 66 or a conductive layer 68. LED component 40 shown in FIG. 6B can but does not have to comprise a conductive thermal via 70 or thermal pad 72 or a protruding layer 74 shown in FIG. 6A. Otherwise, LED component 40 as shown in FIG. 6B can comprise identical features and structures to the embodiment shown in FIG. 6A.

Referring to FIG. 7, a bottom surface 48 of LED component 40 is illustrated. The bottom of LED component 40 features a conductive bottom pattern comprising thermal pad 72 and one or more electrode pads 76. One or more protruding layer 74 can be deposited upon thermal pad 72. Conductive bottom pattern can form, for example, by deposition of electrically and thermally conductive materials, for example silver, by screen printing or other method known in the art. The conductive bottom pattern can comprise a uniform thickness. Via imprint 78 is shown and can for example be convex or concave. Protruding layer 74 can improve the wetting of the thermal and electrode pads during a soldering process used, for example, to connect the LED component 40 to an external source, for example, a PCB. The conductive bottom pattern of LED component 40 typically becomes mounted to the PCB typically by using solder technology. Ideally, the entire surfaces of conductive bottom pattern comprising thermal pad 72 and one or more electrode pads 76 need wetted by the solder to minimize voids in the solder joint. Protruding layer 74 can improve the wetting of these bottom pads during soldering, and can provide for a more reliable solder joint, thus increasing the heat dissipated as well as prolonging life of the LED component 40.

Figure 8:
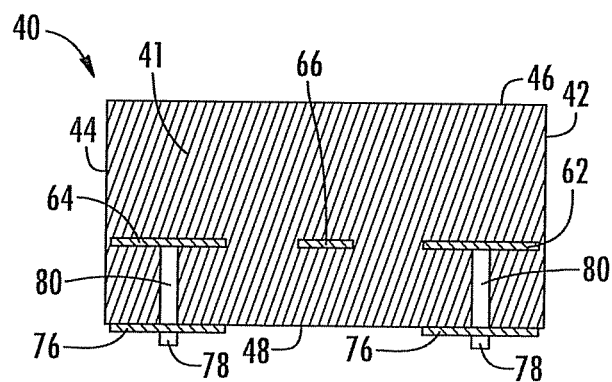
FIG. 8 illustrates a cross-sectional view of a light emitter device component along line 8-8 of FIG. 4.

Referring now to FIG. 8, a cross-sectional view along line 8-8 from FIG. 4 is illustrated. Here, the cross-sectional view is taken along a line which does not bisect the recess opening. In this view, one or more conductive electrical vias 80 are disposed, or buried, within the body 41 of the LED component, and further disposed between the first and second electrical components, 62 and 64 and one or more electrode pads 76 of LED component 40. Conductive electrical vias 80 can optionally be located at the four corners of the LED component. Electrical vias 80 serve as conduits for supplying electrical current into the one or more LED chips 58 which cause the LED chips 58 to emit light. Electrical current can flow along a path from the external source such as, for example a PCB, into electrical components 62 and 64, and into the one or more LED chips 58 to emit light from the active layer within LED chips 58.

Figure 9:
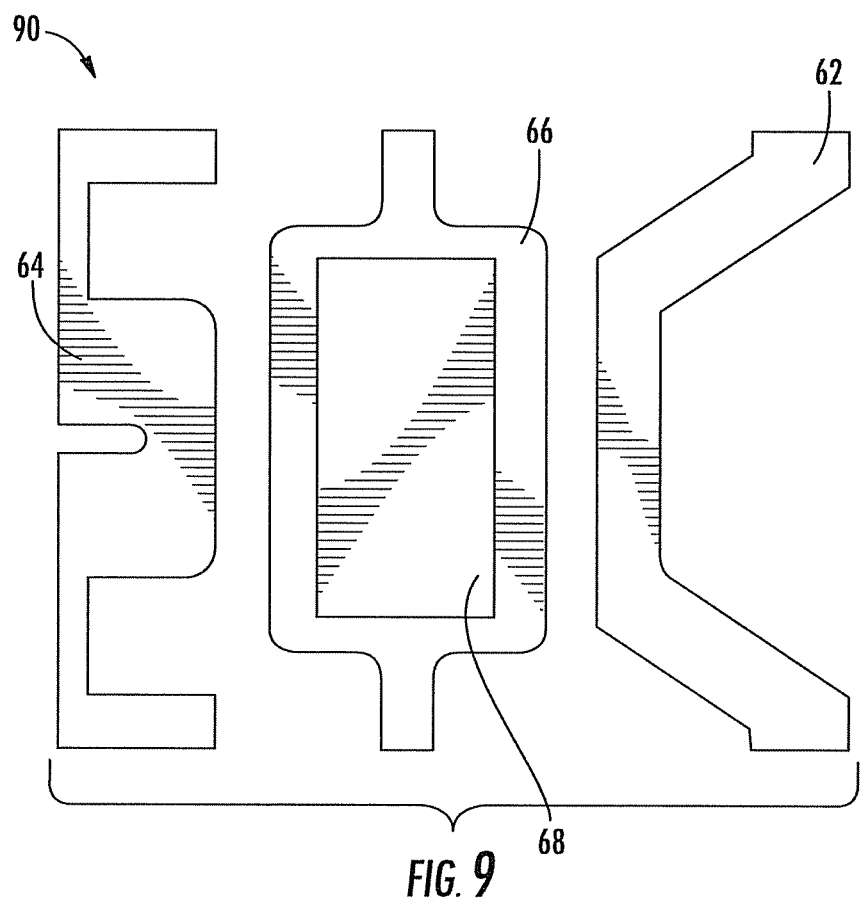
FIG. 9 illustrates a top view of thermal and electrical elements of a light emitter device component according to the present subject matter.

FIG. 9 illustrates a top view of a conductive top pattern, generally designated 90 which can be deposited onto a first portion of body 41 upon lower surface 56 of recess R during processing of LED component 40. For example, conductive top pattern 90 is shown here without having any portion of the pattern covered by body 41. FIG. 4 discussed earlier, illustrates the conductive top pattern 90 within a completed LED component 40 wherein the pattern becomes partially covered by body 41, particularly the walled area around the recess. First conductive top pattern 90 comprises thermal component 66 and first and second electrical components 62 and 64, respectively. Conductive top pattern 90 can be deposited onto a first portion of body 41 during processing of the LED component using, for example, a screen-printing process or any other deposition process known in the art. Conductive top pattern 90 can comprise any thermally and electrically conductive material known in the art, for example silver metal. One or more additional conductive layers 68 can be deposited upon thermal component 66 and/or electrical components 62 and 64, respectively, to further improve spreading heat and managing thermal properties within the LED component 40.

Figure 10:
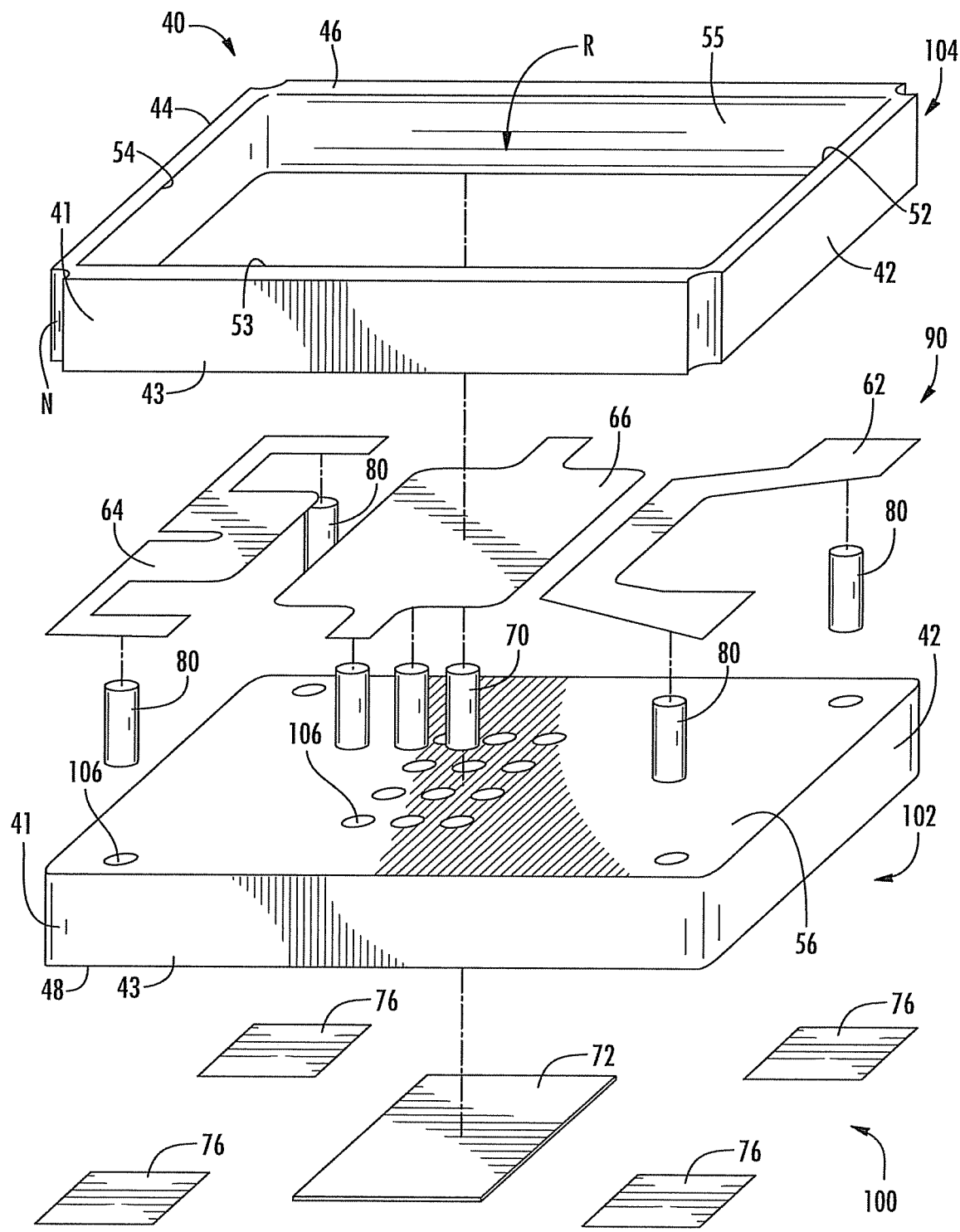
FIG. 10 illustrates an exploded view of a light emitter device component according to the present subject matter.

FIG. 10 illustrates in one aspect an exploded view of the components forming of LED component 40. For example, LED component 40 can comprise an optional conductive bottom pattern 100, a first portion 102 of the body 41, conductive top pattern 90, and a second portion 104 of the body 41, all generally designated in FIG. 10. Second portion 104 can be a different material from the other structures forming LED component 40, such as for example a retention or dam material that can be formed in any suitable manner, such as by dispensing. Conductive top pattern 90 and conductive bottom pattern 100 can be substantially aligned on opposing sides of first portion 102 of the body. Conductive bottom pattern 100 can be a pattern comprising the thermal pad 72 and one or more electrode pads 76. The pattern can be any size, shape, or geometry known in the art. Conductive bottom pattern 100 can be deposited onto at least a portion of the opposing bottom surface 48 of first portion 102 of the body using screen-printing technology or any other deposition method known in the art. Conductive bottom pattern 100 can comprise any thermally and electrically conductive material known in the art, for example, silver. Conductive bottom pattern 100 comprises a layer having a substantially uniform thickness. One or more additional layers may be deposited onto thermal pad 72 and or electrode pad 76, for example protruding layer 74 (FIG.

7). Optional conductive bottom pattern 100 can be aligned with optional holes 106 in the first portion 102 of the body such that the conductive bottom pattern 100 can thermally and electrically connect to conductive top pattern 90 through the conductive thermal 70 and electrical 80 vias. The holes 106 extend through the first portion of body 102.

First portion 102 of the body can comprise a first substrate formed using low-temperature co-fired ceramic (LTCC) materials and technology. For example, first portion 102 can comprise a substrate cast from a thin green ceramic tape. The ceramic tape can comprise any ceramic filler material known in the art, for example, glass ceramics such as aluminum oxide ($Al_2O_3$) or aluminum nitride (AlN) having 0.3 to 0.5 weight percent of glass frits. The glass frits can be used as a binder and/or sintering inhibitor within the ceramic tape when the tape is fired. A green tape can be formed by casting a thick layer of a slurry dispersion of the glass frit, ceramic filler, one or more additional binders, and a volatile solvent. The cast layer can be heated at low temperatures to remove the volatile solvent. A green ceramic tape used for the first 102 and second 104 portions of the body can advantageously comprise any thickness desired, thus contributing to a thinner size when desired. First portion 102 of the body can be punched, or otherwise patterned, with one or more holes 106 extending through the body. Holes 106 can be filled with a conductive material forming the conductive thermal vias 70 and conductive electrical vias 80. For illustrative purposes, and to avoid crowding, a first row of conductive thermal vias 70 is shown. Remaining rows of conductive thermal vias 70 can also be present and fill the remaining holes 106. Conductive thermal vias 70 and conductive electrical vias 80 can comprise the same material, and can be disposed within the same first portion 102 of the body. Conductive thermal 70 and electrical vias 80 can be located substantially parallel to each other, and buried adjacent to each other within the first portion 102 of the body. Once punched, and prior to firing the ceramic tape, the holes 106 can be filled with a conductive powder metal material, or a conductive metal paste, for example, a silver powder metal material or paste. The metal material (powder or paste) can sinter to form a solid body of metal during co-firing of the first and second portions of the body 102 and 104, respectively. As used herein, "firing" means heating the assemblage in an oxidizing atmosphere for a sufficient amount of time to sinter any glass or metal in the layers and densify the entire assemblage comprising LED component 40. In addition to desirable thermal properties, LTCC materials comprise the desirable ability to cast, fold, and punch the ceramic tape prior to co-firing to form one or more buried conductive thermal 70 and electrical 80 vias. Thus, it is contemplated that LED components 40 can be designed using LTCC materials comprising multiple plies of ceramic tape substrates, thereby forming multiple substrate portions of the body. In addition to the body portions and patterned conductive layers disclosed herein, it is also contemplated to design LED components 40 using multiple layers of patterned conductive metal disposed between the multiple plies of ceramic tape and connected by conductive thermal and electrical vias.

Figure 11A:
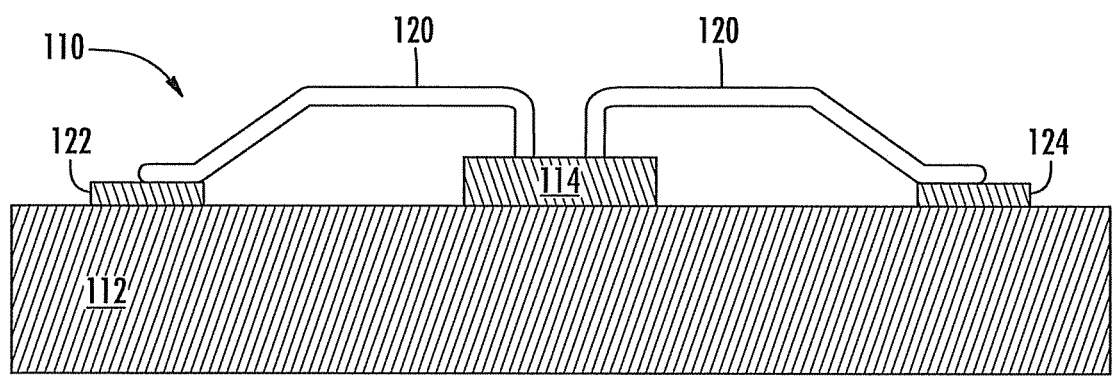
FIGS. 11A and 11B illustrate cross-sectional views of further embodiments of a light emitter device component according to the present subject matter.
Figure 11B:
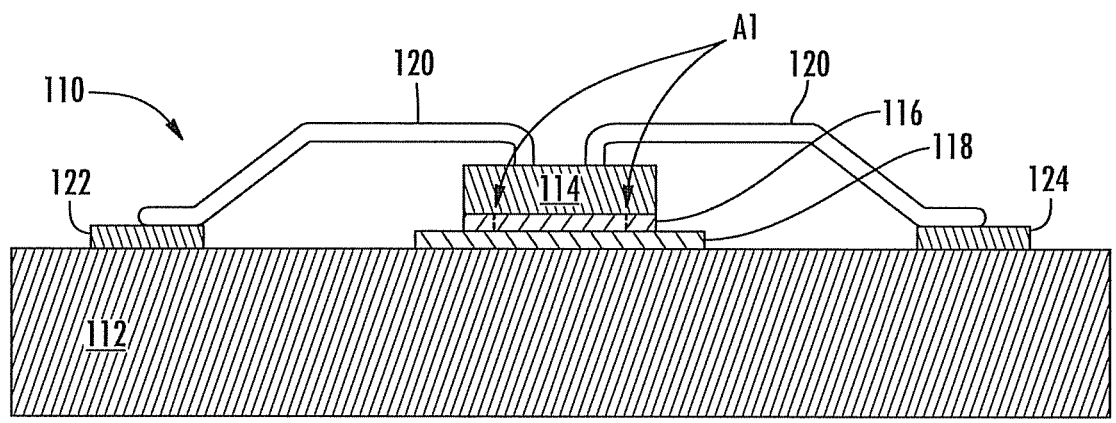

As discussed with respect to FIG. 9, FIG. 10 illustrates the placement of conductive top pattern 90 which can be disposed on at least a portion of a top surface, that is, the lower surface 56 of the recess. Conductive top pattern 90 can be substantially aligned upon lower surface 56 of the recess which opposes the bottom surface 48 of the body upon which the conductive bottom pattern 100 is deposited. The conductive top pattern 90 comprises thermal component 66 and first and second electrical components 62 and 64, respectively. Conductive top pattern 90 can comprise a uniform thickness formed by depositing a conductive material, such as silver, using a screen-printing technology or other deposition method known in the art. Conductive top pattern 90 forms above and substantially aligned with holes 106 which are filled with conductive material. Conductive top pattern 90 can thereby electrically and thermally connect to conductive bottom pattern 100 through the conductive thermal 70 and electrical 80 vias. Second portion 104 of the body can comprise a second substrate formed from a green ceramic tape formed, for example, from the same LTCC materials and technology forming the first portion 102 of the body. Second portion 104 can comprise a recess punched, machined, or otherwise formed therein and defined by inner walls 52 to 55. Inner walls can comprise a uniform thickness or in the alternative can gently slope towards lower surface 56 of the recess formed on first portion 102 of the body. Second portion 104 can comprise outer walls 42 to 45, in one aspect forming a substantially square component. At least a portion of the thickness formed by inner 42 to 45 and outer 52 to 55 walls can be mounted upon a portion of conductive top pattern 90. That is, conductive top pattern 90 can be disposed on the lower surface 56 of the recess between the first 102 and second 104 portions of the body. When co-fired, first 102 and second 104 portions of the body adhere together and fully densify thereby creating a single, uniform body 41 of LED component 40. Using LTCC substrates having conductive thermal 70 and electrical vias 80 can advantageously allow for a small footprint as well as a thinner component. Referring now to FIGS. 11A and 11B, LED component 110 is shown in further aspects according to the subject matter disclosed herein. LED component 110 as shown for example in FIG. 11A can comprise a ceramic substrate or body 112 that can be of any suitable shape and configuration. Body 112 can for example be formed without any cavity or recess so that one or more LED chips 114 are disposed on and can mount to body 112. As one example, body 112 can comprise a surface, such as an upper surface, that can but does not have to be disposed along a single plane. In one aspect, the surface can be in a recess such as that shown in any of the other embodiments and figures for example. The one or more LED chip(s) such as LED chip 114 can be mounted directly to the surface of body 112 without any intervening layer, such as a metal or other layer, between body 112 and LED chip 114 as shown for example in FIG. 11A. Alternatively, the one or more LED chip(s) such as LED chip 114 can be mounted indirectly to the surface of ceramic body 112 as shown for example in FIG. 11B where LED chip 114 is mounted to an intervening layer 116 that can be a non-metallic layer. One or more than one intervening layer can be used and all of them can be non-metallic layers. For example and without limitation, intervening layer 118 can also be disposed between body 112 and LED chip 114 as shown in FIG. 11B where intervening layer 118 is below and against intervening layer 116. The one or more intervening layer(s) can be of a width that is identical to, less than or greater than the width of LED chip 114. As an example, intervening layer 118 is shown with a width that is wider than that of LED chip 114, and arrows Al in FIG. 11B indicate broken lines to illustrate where intervening layer 118 could extend to instead as one example where intervening layer 118 would have a width that is less that the width of LED chip 114. LED chip 114 can be electrically connected, such as by wirebonds 120, to electrical components, referred to also as traces, such as first and second electrical components 122 and 124. One of the first and second electrical components 122 and 124 can serve as a cathode and the other as anode for supplying LED chips 114 with current to illuminate an active layer within the LED chip. Alternatively, LED chip 114 may be flip-chip bonded to the first and second electrical components. Any other suitable bonding techniques could be used as well.

Embodiments of the present disclosure shown in the drawings and described above are exemplary of numerous embodiments that can be made within the scope of the appended claims. It is contemplated that the configurations of LED components such as those disclosed herein can comprise numerous configurations other than those specifically disclosed.

What is claimed is:

1. A light emitter device component comprising:
    a body comprising a first external surface, a second external surface that opposes the first external surface, and a cavity disposed in the body between the first and second external surfaces, wherein the cavity comprises a mounting surface and inner walls that extend between the mounting surface and the first external surface of the body; and
    one or more light emitter chips disposed on the mounting surface of the cavity;
    wherein the first external surface of the body comprises a first planar surface area that is less than or equal to a threshold ratio of 0.25, or 25% of a second planar surface area of the second external surface, the second planar surface area being defined in a single plane.

2. The light emitter device component according to claim 1, wherein the threshold ratio comprises a range from 0.21 to 0.25 of the second planar surface area.

3. The light emitter device component according to claim 1, wherein the light emitter chips comprise light emitting diode (LED) chips, each of which comprise two top side contacts.

4. The light emitter device component according to claim 1, wherein the body comprises a low-temperature co-fired ceramic (LTCC) material.

5. The light emitter device component according to claim 4, wherein the body comprises a substantially square shaped body.

6. The light emitter device component according to claim 1, wherein the inner walls define the cavity and comprise a uniform thickness.

7. The light emitter device component according to claim 4, wherein the LTCC material comprises buried conductive thermal and electrical vias.

8. The light emitter device component according to claim 7, wherein the buried conductive thermal and electrical vias comprise silver.

9. The light emitter device component according to claim 7, wherein the conductive thermal and electrical vias are disposed in the LTCC material between a first patterned conductive layer and a second patterned conductive layer, such that the first and second patterned conductive layers are electrically and thermally connected by the conductive thermal and electrical vias.

10. The light emitter device component according to claim 1, wherein the inner walls define the cavity and gradually slope towards the mounting surface.

11. The light emitter device component according to claim 1, wherein the one or more light emitter chips are indirectly mounted to the mounting surface such that at least one or more intervening layers are disposed between the one or more light emitter chips and the mounting surface.

12. The light emitter device component according to claim 1, wherein the one or more light emitter chips are attached directly to the mounting surface via attachment material.

13. A light emitter device component comprising:
    a body having a first external surface, a second external surface opposing the first external surface, and a cavity disposed in the body, wherein the cavity comprises a mounting surface and inner walls that extend between the mounting surface and the first external surface;
    a first conductive pattern disposed on the mounting surface, wherein the first conductive pattern comprises a first thermal trace and first and second electrical traces, wherein the first thermal trace is separated from each of the first and second electrical traces;
    one or more light emitting diode (LED) chips disposed on the first thermal trace and electrically connected to the first and second electrical traces;
    a second conductive pattern disposed on the second external surface, wherein the second conductive pattern comprises a second thermal trace and a plurality of electrical traces; and
    a plurality of conductive vias, wherein at least some of the plurality of vias connect the first thermal trace to the second thermal trace, and wherein at least some others of the plurality of conductive vias connect each of the first and second electrical traces to a respective electrical trace of the plurality of electrical traces disposed on the second external surface of the body.

14. The light emitter device component according to claim 13, wherein the plurality of conductive vias comprise silver vias buried adjacent each other within the body.

15. The light emitter device component according to claim 13, wherein the first external surface of the body comprises a first planar surface area that is less than or equal to a threshold ratio of 0.25, or 25% of a second planar surface area of the second external surface.

16. The light emitter device component according to claim 15, wherein the threshold ratio comprises a range from 0.21 to 0.25 of the second planar surface area.

17. The light emitter device component according to claim 13, wherein the body comprises low-temperature co-fired ceramic (LTCC) materials.

18. The light emitter device component according to claim 17, wherein LTCC materials comprise aluminum oxide (Al2O3) having 0.3 to 0.5 weight percent glass frits.

19. A method of forming a light emitter device component having increased brightness, the method comprising:
    providing a light emitter device component, the package comprising:
        a body having a top surface of an overall surface area, the top surface comprising inner walls defining a recess with a recess opening; and
        one or more light emitter devices mounted on a lower surface of the recess; and
    forming the recess in the top surface of the light emitter device component, wherein the top surface comprises an area remaining outside of the opening of the recess, wherein the area remaining outside is less than or equal to a threshold ratio of 0.25, or 25% of the overall surface area.

20. The method according to claim 19, wherein forming the recess comprises forming an opening of the recess such that area remaining outside is a range from 0.21 to 0.25 of the overall surface area.

21. The method according to claim 20, wherein providing the body comprises providing first and second substrates of green low-temperature co-fired ceramic (LTCC) tape and co-firing the first and second substrates together to form a single uniform body.

22. The method according to claim 21, wherein at least one of the first or second substrates of LTCC tape comprises conductive thermal and electrical vias disposed therein connecting a first layer of patterned conductive material to a second layer of patterned conductive material.

23. A light emitter device component comprising:
a ceramic body having a planar first surface;
a conductive pattern disposed on the first surface, wherein the conductive pattern comprises a thermal trace and first and second electrical traces, wherein the thermal trace is separated from each of the first and second electrical traces, and wherein the first and second electrical traces extend toward and not beyond outermost edges of the first surface;
one or more light emitter chips disposed over the conductive pattern; and
one or more intervening layers of electrically conductive or non-conductive material disposed between the one or more light emitter chips and the conductive pattern.

24. The light emitter device component according to claim 23, wherein the one or more intervening layers are non-metallic.

25. The light emitter device component according to claim 23, comprising a plurality of intervening layers.

26. The light emitter device component according to claim 23, wherein the one or more intervening layers has a width that is greater than a width of the light emitter chips.

27. The light emitter device component according to claim 23, wherein the one or more intervening layers has a width that is less than a width of the light emitter chips.

28. The light emitter device component according to claim 23, wherein the one or more intervening layers has a width that is identical to a width of the light emitter chips.

29. The light emitter device component according to claim 23 wherein the ceramic body comprises a high temperature co-fired ceramic (HTCC) body.

30. The light emitter device component according to claim 23 wherein the ceramic body comprises a low temperature co-fired ceramic (LTCC) body.

31. The light emitter device component according to claim 23, wherein the first surface of the ceramic body is within a recess of the ceramic body.

32. A light emitter device component comprising:
a ceramic body having a first surface and a second surface opposite the first surface;
a conductive pattern disposed on the first surface, wherein the conductive pattern comprises a first thermal trace and first and second electrical traces, wherein the first thermal trace is separated from each of the first and second electrical traces;
one or more light emitter chips disposed on the first thermal trace;
a second thermal trace disposed below the first thermal trace; and
a plurality of conductive vias, wherein at least some of the plurality of vias are disposed in the ceramic body below the one or more light emitter chips to connect the first thermal trace to the second thermal trace, and wherein at least some others of the plurality of conductive vias connect each of the first and second electrical traces to a respective electrical trace disposed on the second surface of the body.

33. The light emitter device component according to claim 32 wherein the ceramic body comprises a high temperature co-fired ceramic (HTCC) body.

34. The light emitter device component according to claim 32 wherein the ceramic body comprises a low temperature co-fired ceramic (LTCC) body.

35. The light emitter device component according to claim 32, wherein the first surface of the ceramic body is within a recess of the ceramic body.

* * * * *